United States Patent

Yamamoto

[11] Patent Number: 5,581,452
[45] Date of Patent: Dec. 3, 1996

[54] PULSE WIDTH MODULATION INVERTER CURRENT DETECTION METHOD

[75] Inventor: Yasuhiro Yamamoto, Tokyo, Japan

[73] Assignee: Kabushiki Kaisha Meidensha, Tokyo, Japan

[21] Appl. No.: 132,953

[22] Filed: Oct. 7, 1993

[51] Int. Cl.$^6$ .............................. H02M 1/12; H02P 7/628
[52] U.S. Cl. .............................................. 363/41; 318/811
[58] Field of Search ................................. 363/37, 39, 40, 363/41, 44, 45, 46, 81, 84; 318/138, 254, 800, 801, 809, 810, 811

[56] References Cited

U.S. PATENT DOCUMENTS

| | | | |
|---|---|---|---|
| 4,763,060 | 8/1988 | Takahashi | 363/41 |
| 4,862,343 | 8/1989 | Nomura et al. | 363/41 |
| 4,962,976 | 10/1990 | Takahashi et al. | 318/81 |
| 4,967,135 | 10/1990 | Ashikaga et al. | 318/808 |
| 5,023,538 | 6/1991 | Mutoh et al. | 318/811 |
| 5,155,797 | 10/1992 | Nomura et al. | 388/815 |
| 5,313,147 | 5/1994 | Yoneda et al. | 318/569 |

FOREIGN PATENT DOCUMENTS 0333054  9/1989  European Pat. Off. .......... H02P 5/40

OTHER PUBLICATIONS

Patent Abstracts of Japan, vol. 016, No. 550 (E–1292) Nov. 19, 1992.
Patent Abstracts of Japan, vol. 015, No. 494 (E–1145) Dec. 13, 1991.
Patent Abstracts of Japan, vol. 015, No. 223 (E–1075) Jun. 7, 1991.

*Primary Examiner*—Matthew V. Nguyen
*Attorney, Agent, or Firm*—Foley & Lardner

[57] ABSTRACT

A current detection method for current detection of an output of a PWM inverter utilitizes current sampling at the timings of two zero vectors of the PWM inverter and selecting the sample value least influenced by noise as the detected current sample value and, when a time difference between the two vectors is large, an average value of the two sample values is selected.

4 Claims, 4 Drawing Sheets

PULSE WIDTH MODULATION INVERTER CURRENT DETECTION METHOD

BACKGROUND OF THE INVENTION

1. Field of the Invention

The present invention relates generally to a current detection method utilizing pulse width modulation. Specifically, the invention relates to a current control method for digital current control applications using a PWM (Pulse Width Modulation) inverter, particularly when a high carrier frequency is utilized.

2. Description of the Prior Art

In such devices as variable speed motor driving arrangements, non-stop electrical sources and the like, PWM inverters are often employed for improving wave recognition. Further, when an IGBT (insulated-gate bipolar transistor), FET-MOS, high speed switching terminal or the like is employed in a main circuit of such a PWM inverter, an even higher level of improvement can be realized.

In a PWM inverter, control of voltage and vector control are mutually dependent. For example, referring to FIG. 4, a block diagram of a PWM inverter for current control is shown. As may be seen, a vector control portion 1 requires a speed current demand, a torque current demand as well as a control frequency and outputs a magnetic induction current demand ild and a perpendicular torque demand ilq to an ACR portion 2. The ACR (digital current control) portion 2 receives both the magnetic induction current demand ild and the torque current demand ilq and a detected current variation and performs proportional integral (PI) current control. Then, the ACR converts the 2 phase input to a 3 phase output in the form of voltage demands Vu, Vv, Vw (and a coordinate signal) to a PWM (pulse wave modulation) pattern generator 3. At the PWM pattern generator, from the voltage demands for each phase, the carrier frequency and pattern data from the pattern generator 3, PWM patterns for each phase-are generated and output to a main circuit 4 from which a voltage and phase of the output are determined and supplied to an induction motor 5.

A speed detector 6 associated with the induction motor 5 outputs an angular speed signal ωr to an adder 7. Based on the angular speed signal ωr and the control frequency ωs the adder 7 outputs a electrical source angular speed signal ωo to the ACR portion 2. Further, a current detecting hall element 8, or the like is interposed between the main circuit 4 and the induction motor 5 and provides a sample of the detected current value for each phase via a sample and hold circuit 9.

The current values-for each phase sampled by the sample and hold circuit 9 are converted to a digital value at an A/D (analog/digital) converter 10 and the digital values are supplied to the ACR portion 2 where the three phase input coordinates are converted to two phase coordinates for carrying out digital current control.

However, according to such an arrangement, when the PWM current is affected by a 'ripple' component at the sampling timing of the sample and hold circuit, the true current output of the inverter cannot be reliably detected since ripple noise present at the sampling timing becomes superimposed over subsequent samplings.

For overcoming this drawback, the present applicant has previously proposed (i.e. in Japanese Patent Application First Publication 8-215182), that when a current sampling timing coincides with output of the PWM pattern, suitable control of the sampling timing may be implemented such that it is possible to detect the average value of one PWM cycle period and an equivalent detected current value in one sampling operation.

By the above-described current detection method, influence of variation of a ripple component on PWM may be eliminated and current may be certainly detected and, since use of a low pass filter or the like is not necessary, a response time for detection may be considerably improved.

However, in such conventional current detecting methods, an inverter main circuit utilizes an IGBT high-speed switching element which, when a PWM waveform generating portion utilizes a substantially high frequency carrier, a size of the IGBT switching element must be substantially large (i.e. 1–3 μsec in width). In addition, a high carrier frequency accompanies a high switching frequency which causes ripple noise to accumulate because of voltage switching at the sampling point, as will be explained below with reference to FIG. 5.

Referring to the drawing, a typical three phase voltage pattern and U phase current waveform are represented. In each PWM sampling period Tc the same waveform is repeatedly sampled. Thus, in each sampling period a symmetrical voltage waveform is present and one cycle of the carrier frequency is restricted to ½ the smallest unit of the PWM waveform.

Inside of the current waveform, the PWM cycle period Tc corresponds to a U-phase component Iu of the current waveform, and at a punctuation point (indicated by arrows) indicating the smallest unit of the PMW waveform, or ½ of a current ripple of ΔI, sampling may be accomplished which gives an average value of the current ripple.

In the above described same period current sampling, detection signals are produced for each phase of current (i.e. waveforms Iu, Iv, and Iw), though FIG. 5 shows only the waveform Iu. The voltage switching timing for each phase causes superimposed current ripple noise to accumulate. When the arrow indicated current sampling points differ from the basic PWM cycle period Tc, this ripple noise does not appear in the detection period, at high carrier frequencies, and the sampling points and the noise generation points become undesirably close together. Thus, delay of IGBT switching (which is inherently from several μsec to several tens of μsec) is incurred since the amplitudes of sampling points approach the inherent switching speed of the IGBT. This tendency, becomes marked when the PWM voltage demand becomes high, that is when the voltage control factor approaches 1. Therefore, it has been required to provide a noise filter during current detection without delay of response time of operation.

SUMMARY OF THE INVENTION

It is therefore a principal object of the present invention to overcome the drawbacks of the prior art.

It is a further object of the present invention to provide a PWM current detection method in which a noise filter may be provided during current detection without delay of response time of operation.

In order to accomplish the aforementioned and other objects, a current detection method wherein same period current sampling for a PWM inverter output is utilized comprising: sampling a current of the PWM inverter output according to two zero vector timings thereof; determining a time difference between two sample values obtained in the sampling step and a voltage switching timing of the PWM inverter output; and, selecting one of the sample values showing the least influence of noise as the current detection value.

DESCRIPTION OF THE PREFERRED EMBODIMENT

Figure 1:
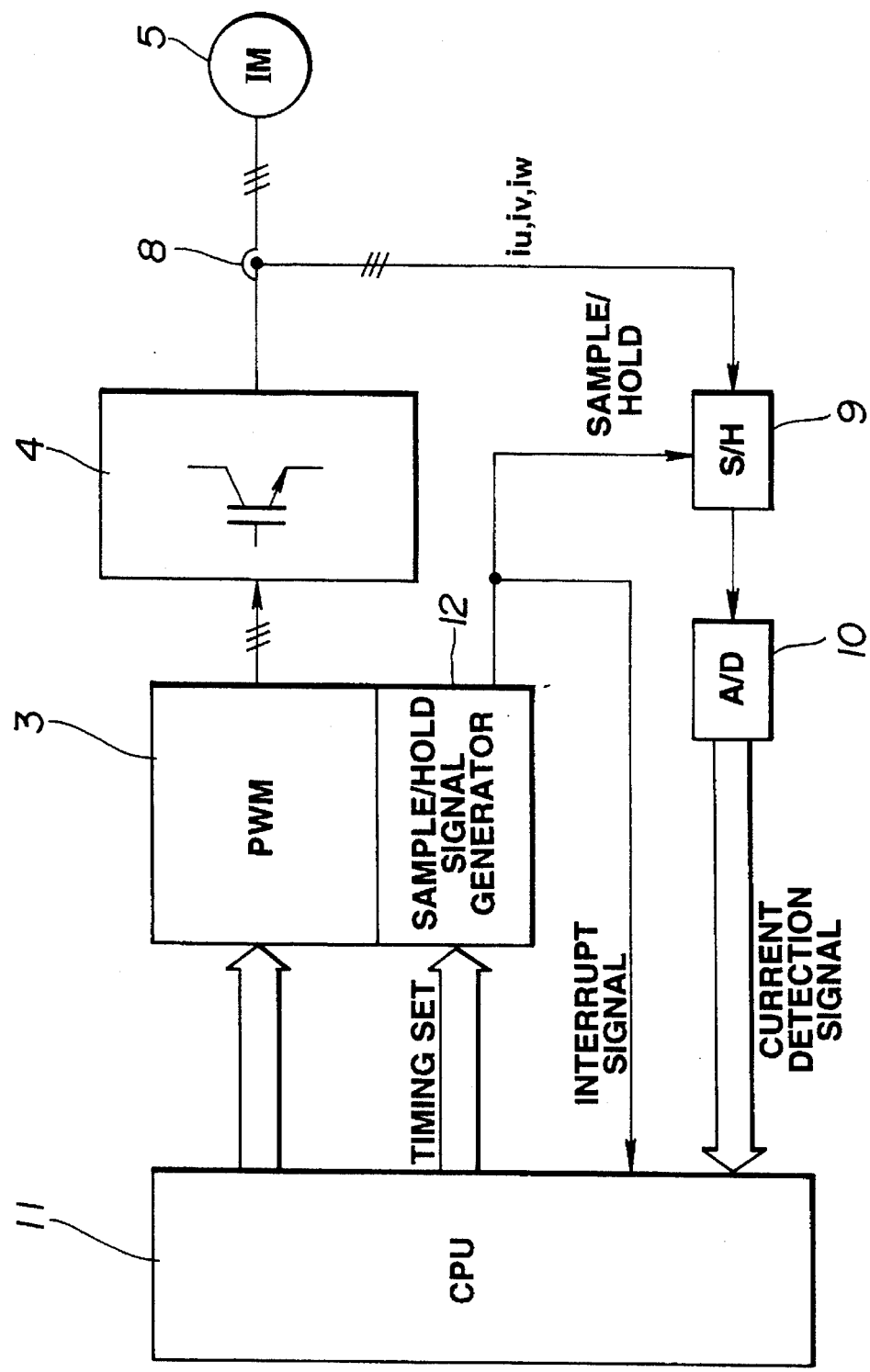
FIG. 1 is a block diagram illustrating operation of a current detection method according to a preferred embodiment of the invention.
Figure 4:
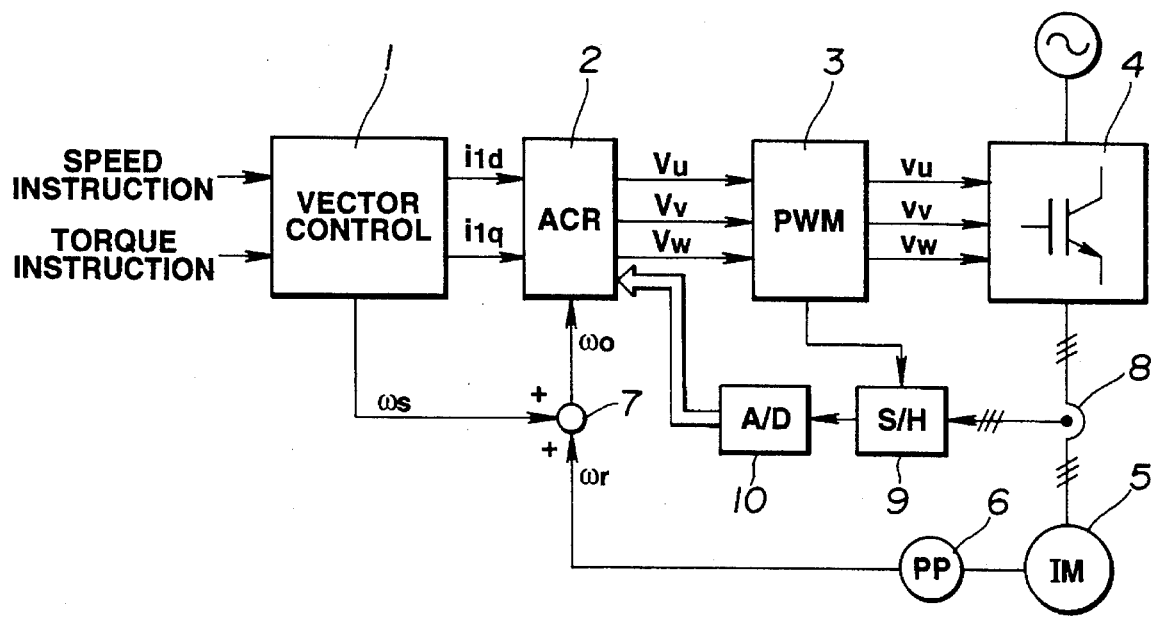
FIG. 4 shows a block diagram of a conventional PWM inverter utilized for current detection.
Figure 5:
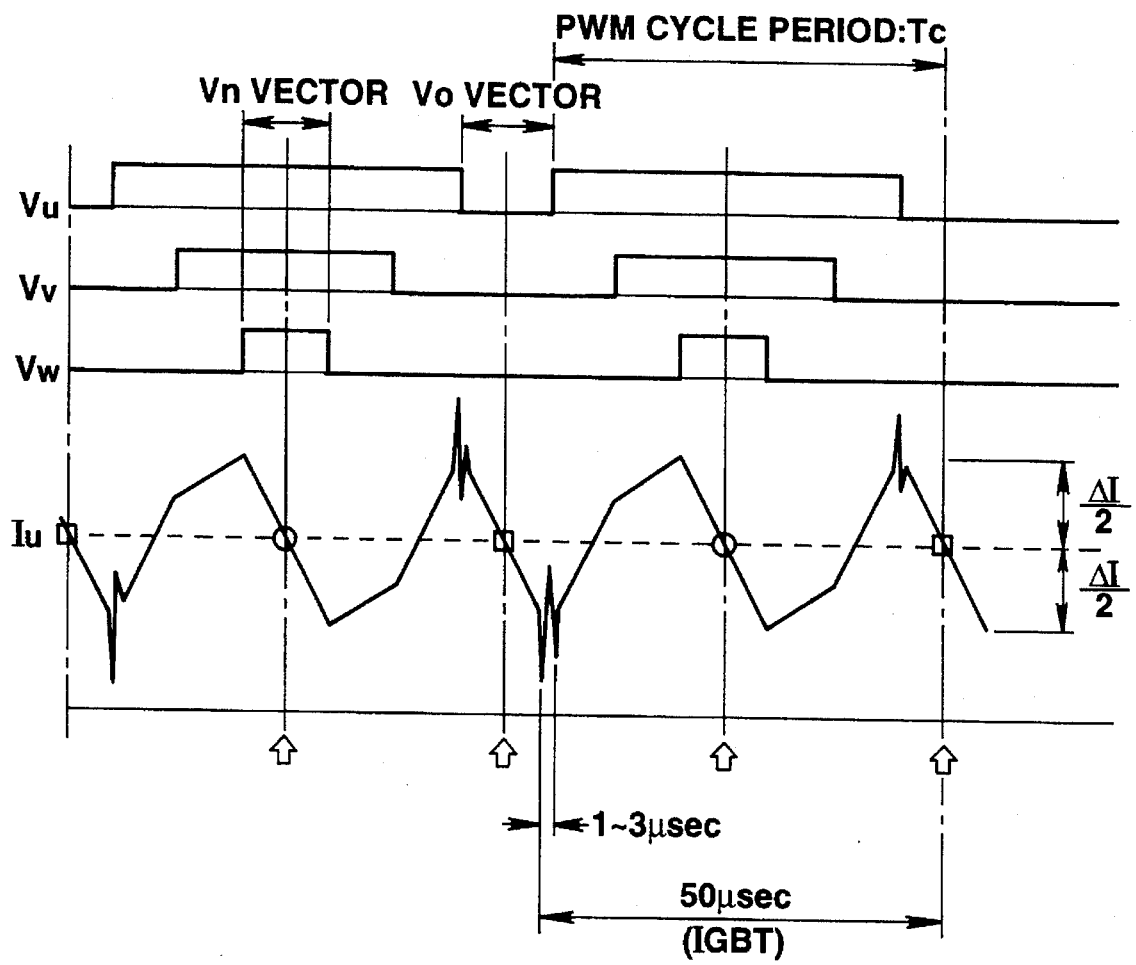
FIG. 5 is a waveform diagram of same period current sampling showing voltage pattern and current as may be derived from the conventional PWM inverter of FIG. 4.

Referring now to the drawings, particularly to FIG. 1, it may be seen that the current detection method according to the invention-utilizes a CPU 11 (i.e. a computer) for digitally carrying out the functions of the vector control portion 1 and the current control portion 2 shown in FIG. 4. The CPU 11 is connected to a PWM pattern generator 3 having PWM pattern data stored therein while a speed control connection is not shown in the drawings.

A timing of a sample and hold signal generating circuit 12 is set by the CPU 11. This timing as well as a PWM timing of the PWM pattern generator 3 is determined by a sample and hold signal from the sample and hold signal generating circuit to a sample and hold circuit 9 and an interrupt signal to the CPU 11.

The sample and hold timing of the sample and hold signal generating circuit depends on two zero vectors V0, V7 for each phase of a PWM voltage pulse. The timings of both zero vectors V0, V7 are included in the timing set signal output by the CPU 11. When a sampling period is complete, the interrupt signal timing is obtained by the CPU 11, and A/D variations and sample data for the zero vectors V0 and V7 are input to the CPU 11 at every cycle.

Figure 2:
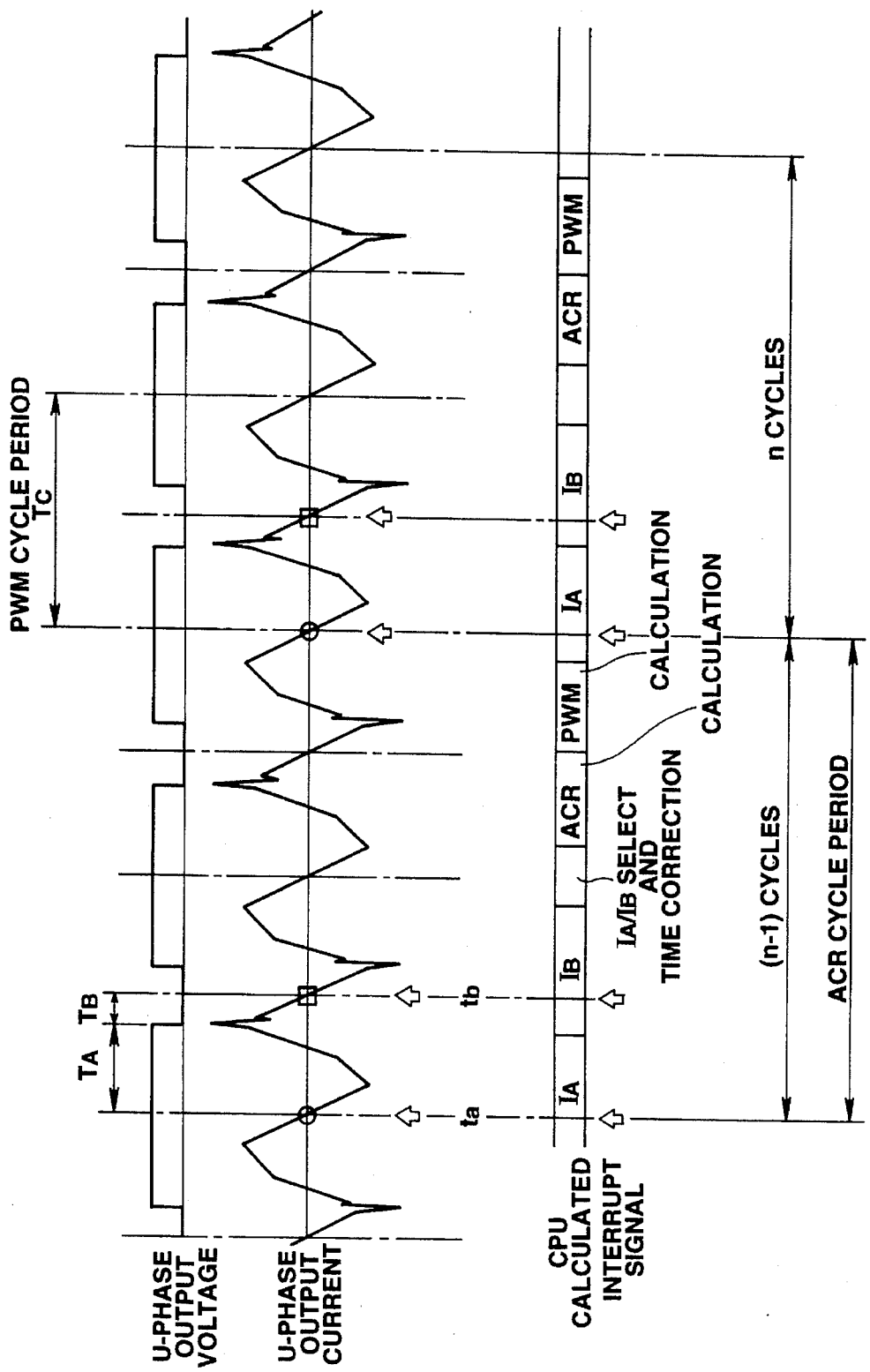
FIG. 2 is a timing chart of operation according to the preferred embodiment.

Referring now to FIG. 2, a sample and hold time chart according to the preferred embodiment shows an output U-phase voltage and U-phase current according to the internal calculation of the CPU 11 and the input interrupt signal. Similar processing is also carried out for V-phase and W-phase components.

The half cycle period of the PWM waveform is the smallest time unit of current control. The cycle period of the PWM waveform is equal to half the current control operation cycle period (ACR cycle period). This smallest unit is repeated N times (eg. N=4 in the drawings). Current sampling is carried out on the basis of the vector timings for the zero vectors V0 and V7.

(1) At the time of a first current sampling (first hold action by the sample and hold circuit 9), at a time ta, an interrupt signal is input to the CPU 11. At this time a current sampling is set according to a first interrupt variable IA from the A/D converter 10. Then the next interrupt timing and current sampling timing is set at a time tb (equal to half of the PWM cycle period Tc) at the sample and hold signal generating circuit 12.

(2) The timing tb is set in the first sampling for execution of the second current sampling, the second current sampling is affected by a second interrupt variable IB.

(3) After completion of the second sampling, the CPU 11 sets a pulse width at times TA and TB, via a PWM pattern from the PWM pattern generator 3 and a time difference between current sampling points ta, tb, and a switch timing of switch elements. From the times TA, TB the variables IA, IB adopted for each current sample value are determined.

If the time TB is determined and a long period of no ripple noise interference is determined the variable IB is adopted for the current sampling value while, if a short value of ripple noise interference is determined the variable IA is adopted as the current sampling value. Basically the sampling value of the second sampling is preferably adopted.

However, if the first interrupt variable (IA) of the first sampling is adopted, since the sampling timing of IA is earlier than that of IB a sampling timing of TA+TB is present. Based on this, time interpolation is carried out as shown in FIG. 3.

Figure 3:
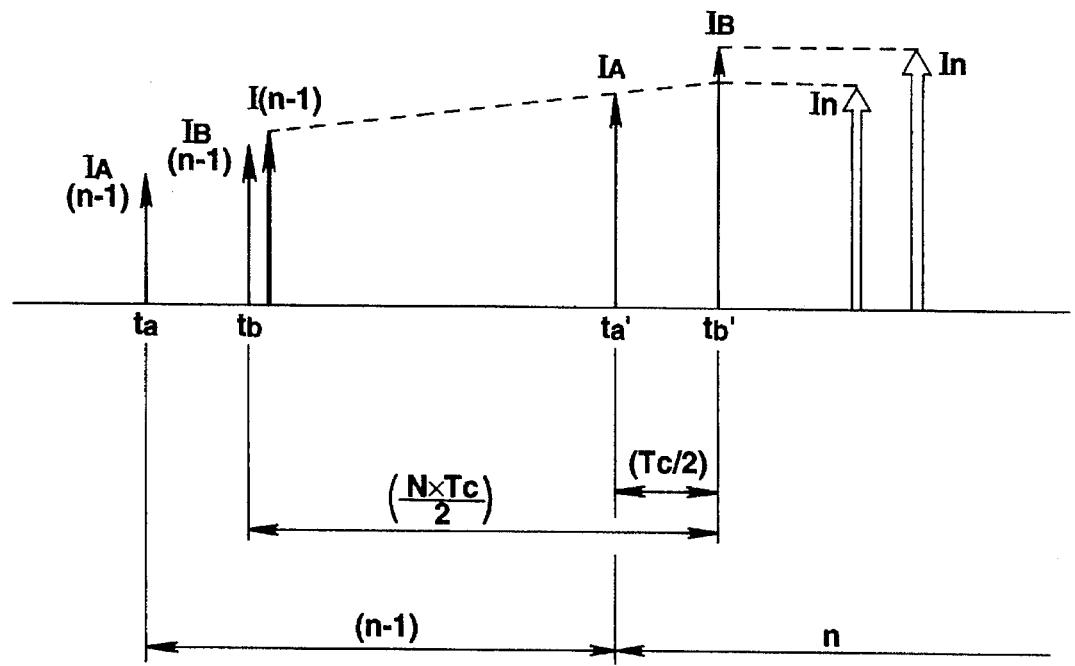
FIG. 3 is an explanatory diagram showing a correction timing according to the preferred embodiment.

Referring to FIG. 3, if a previous sampling cycle (n–1) current sampling value (variable IB) is adopted for current control, detection in the present cycle of a current value IB at a current detection time tb' is-adopted as the sampling level In. Conversely, if a previous sampling cycle (n–1) current sampling value (variable IA) is adopted for current control, detection in the present cycle of a current value IA at a current detection time ta' is adopted as the sampling level In.

A correction for the previously selected data I (n–1) and the present data IA (at the time ta') may be expressed as:

$$In=(N/N-1)\times(IA-I(n-1))+I(n-1)$$

According to this a sample value In always at a timing tb may be approximately obtained.

(4) Referring again to FIG. 2, an interpolation between the variables IA, IB is obtained for the detected current value In of the current demand between the timing for current control (ACR) operation and PWM voltage demand operation.

(5) From the PWM voltage demand an equivalent PWM pattern may be calculated for the next cycle to be written into a memory register of the PWM pattern generator 3. Also, the current sampling and interrupt time of the next cycle may also be determined.

Thus, according to the process steps (1)–(5) as set forth, which are repeated for current control according to the invention, since sampling may be selectably controlled according to two vector timings (V0, V7) the influence of current sampling error is minimized and a ripple component of a current detection signal may be removed such that a true current may be reliably detected.

Further, when a voltage output of a PWM inverter is low, such that a voltage control demand becomes close to '0', a sufficient time difference between the switching and sampling is present. Also, variation in current demand in operation may be held low since current sampling data from the two zero vector sampling points prevents influence of ripple noise. An average of both sample values allow increased accuracy of current detection.

According to this circuit noise as well as A/D fluctuation error as well as same period sampling detection error may be reduced while fast response time may be preserved.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

I claim:

1. A noise filtering circuit arrangement for a current detection operation of a PWM inverter utilizing a substantially high carrier frequency for control of an IGBT switching element, wherein multiple same period current sampling of a PWM inverter output is carried out, the noise filtering circuit comprising:

a CPU outputting a CPU timing signal for vector control and current control;

a sample and hold signal generating circuit, having a sample and hold timing thereof determined dependent on first and second zero vectors for each phase of a PWM voltage pulse, a timing of said first and second zero vectors being derived from said CPU timing signal;

a PWM pattern generator including a memory provided with data enabling said PWM pattern generator to synthesize a plurality of PWM patterns, a PWM timing of said PWM pattern generator being derived from said CPU timing signal;

a sample and hold circuit, a timing thereof being established by a sample and hold signal from said sample and hold signal generating circuit and an interrupt signal to said CPU from said sample and hold signal generating circuit; and an A/D converter, a current value of each sampling period being determined according to a variable output from said A/D converter, wherein a timing of said interrupt signal and sample data from said first and second zero vectors is input to said CPU at cycle end timing corresponding to end timing of a sampling period of said sample and hold circuit, a voltage and current output is calculated by said CPU according to said interrupt signal for each phase of current control, a smallest time unit of current control operation equals half a cycle period of said PWM waveform, a PWM waveform cycle is equal to half of a current control cycle of said PWM inverter, and current sampling is carried out according to the timings of said first and second zero vectors.

2. A noise filtering method for a current detection operation of a PWM inverter utilizing a substantially high carrier frequency for control of an IGBT switching element, wherein multiple same period current sampling of a PWM inverter output is carried out for each phase of a PWM voltage pulse, comprising the following steps:

(a) a first sampling step performed at a first sampling point corresponding to a time of a first hold action by a sample and hold circuit, a first interrupt signal being simultaneously input to a CPU of said inverter and a first current sampling being set according to a variable first current value from an A/D converter of said inverter;

(b) determining a sampling point of a second sampling step, second interrupt signal timing and second current sampling timing;

(c) a second sampling step including a second hold action of said sample and hold circuit, at a timing corresponding to said sampling point calculated at said determining step, second sampling being set according to a timing of said second interrupt signal to obtain a variable second current value;

(d) calculating and setting first and second pulse width times using a PWM pattern derived from a PWM pattern generator of said inverter, a time difference between first and second sampling points and a switch timing of switching elements of said inverter;

(e) determining first and second variable current values corresponding to first and second current sampling values from said first and second pulse width times;

(f) selecting one of said first and second variable current values as a current demand value for said current detection operation wherein, if said first variable current value is selected as said current demand value at said selecting step, interpolation between said first and second variable current values is performed, a result of said interpolation being selected as said current demand value;

(g) carrying out current control operation based on a selected current demand value;

(h) performing PWM voltage demand operation;

(i) synthesizing a PWM pattern based on said PWM voltage demand at said PWM pattern generator to be applied at a subsequent cycle of said current detection operation;

(j) writing said PWM pattern into a memory portion of said PWM pattern generator; and (k) determining a current sampling point and interrupt timing of a next cycle of sampling operation.

3. A method as set forth in claim 2, wherein a sampling point of a second sampling period is set at half of a PWM cycle period.

4. A method as set forth in claim 4, wherein, in a sampling step, a correction for a previously selected variable interrupt value and a variable interrupt value selected in a present sampling step is accomplished according to the following expression:

$$In=(N/N-1)\times(IA-I(n-1))+I(n-1)$$

wherein:

I=a current sampling value;

n=a sampling step being currently executed; and

N=a timing of a cycle period of a PWM voltage pulse.

* * * * *